United States Patent
Chrissostomidis et al.

(10) Patent No.: US 6,507,528 B2
(45) Date of Patent: Jan. 14, 2003

(54) CIRCUIT CONFIGURATION FOR GENERATING SENSE AMPLIFIER CONTROL SIGNALS

(75) Inventors: Ioannis Chrissostomidis, München (DE); Thilo Schaffroth, Röhrmoos (DE); Helmut Fischer, Taufkirchen (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/981,855

(22) Filed: Oct. 18, 2001

(65) Prior Publication Data

US 2002/0075741 A1 Jun. 20, 2002

(30) Foreign Application Priority Data

Oct. 18, 2000 (DE) ......................... 100 51 613

(51) Int. Cl.[7] ................................. G11C 7/00
(52) U.S. Cl. ...................... 365/208; 365/194
(58) Field of Search ............................. 365/207, 208, 365/194

(56) References Cited

U.S. PATENT DOCUMENTS

| | | | | |
|---|---|---|---|---|
| 5,550,778 A | | 8/1996 | Takahashi | 365/207 |
| 5,841,717 A | * | 11/1998 | Yamaguchi | 365/207 |
| 5,936,905 A | * | 8/1999 | Proebsting | 365/208 |
| 6,041,004 A | * | 3/2000 | Haga | 365/207 |
| 6,052,324 A | * | 4/2000 | Tobita | 365/207 |
| 6,097,653 A | | 8/2000 | Park | 365/207 |

* cited by examiner

Primary Examiner—Tan T. Nguyen
(74) Attorney, Agent, or Firm—Laurence A. Greenberg; Werner H. Stemer; Ralph E. Locher

(57) ABSTRACT

A circuit configuration for generating sense amplifier control signals for a DRAM. The circuit configuration includes, in addition to thin oxide transistors that are supplied with a normal standard supply voltage, thick oxide transistors to which an increased supply voltage is applied to compensate for voltage and technological fluctuations.

2 Claims, 5 Drawing Sheets

CIRCUIT CONFIGURATION FOR GENERATING SENSE AMPLIFIER CONTROL SIGNALS

BACKGROUND OF THE INVENTION

FIELD OF THE INVENTION

The present invention relates to a circuit configuration for generating sense amplifier control signals for a memory, in which an addressed word line WL of the memory can be activated via a first current path. The configuration includes a second current path with a control device, in which the sense amplifier control signals are generated from a signal that is derived from the first current path. The configuration also includes a voltage supply device for components of the first and second current paths.

FIG. 4 shows an existing circuit with a first current path 1 illustrated in solid lines and a second current path 2 illustrated in broken lines, which are each for a memory. Such a memory can be, for example, a DRAM, and has a memory cell array 3 including array blocks $4_1$, $4_2$, . . . of memory banks.

Sense amplifiers $SA_1$, $SA_2$, . . . are situated between the array blocks $4_1$, $4_2$, . . . of the memory banks. The memory includes word line decoders 5 for, in each case, a multiplicity of word lines WL (only two word lines are shown) which, in the individual array blocks $4_1$, $4_2$, . . . , lead to the individual rows of memory cells of the memory banks in the array blocks $4_1$, $4_2$, . . . Bit lines BL essentially run perpendicularly to the word lines WL (only two bit lines are shown diagrammatically).

The first current path 1 serves for activating an addressed word line WL. A bank address BNKSEL and a row address ADR are fed together with an activation command AK into the circuit and are stored in a control circuit 6 or ROWSLTH (=Row Slave Latch) provided for this purpose. In the control circuit 6, a signal RAVLD (Row Address Valid) is generated, which is used to initiate the partial decoding of i+1 row addresses BRADD (Bank Row Address) and to select the corresponding array block $4_1$, $4_2$, . . . In the selected array block, the row address is processed further and decoded to such an extent that a word line WL can be selected with it.

In this connection, it should be noted in passing that in parallel with the above process, in all of the array blocks $4_1$, $4_2$, . . . , a comparison between the respective row address and the addresses of repaired word lines is performed through the signal RAVLD. In the event of correspondence (redundancy hit), an associated redundant word line is activated. The predecoded row address is then no longer relevant. If no redundancy hit is present, the corresponding word line is selected from the predecoded row address and activated. However, this operation is of secondary importance for understanding the invention.

Along the selected word lines WL (or redundant word lines), by means of the selection transistors of the memory cells, the cell contents of the addressed memory cells, that is to say the stored data, are then transferred to the bit lines of the memory cells.

In the second current path 2, signals are generated which drive the associated sense amplifiers $SA_1$, $SA_2$, . . . The latter are permitted to be activated, however, only if the contents of the addressed memory cells are reliably transferred to the bit lines.

In order to ensure this, in the second current path 2, which contains, in particular, a sense amplifier timer 7 (RACTRL), a delay is derived from the signal RAVLD, which delay corresponds to the maximum delay in the first current path 1 including the data transfer to the bit lines.

The circuits in the first current path 1 partly include thin oxide transistors and partly include thick oxide transistors. The thin oxide transistors use the standard supply voltage Vint, while the thick oxide transistors are operated with the increased supply voltage VPP relative to the standard supply voltage Vint.

The timing of the sense amplifiers of a memory having a memory cell array is currently generated for each quadrant of the memory cell array in the sense amplifier timer 7 that is central for the respective quadrant. This timing, in which, inter alia, the abovementioned start signal RAVLD signaling the validity of row addresses is evaluated, defines the start time for the evaluation of the cell signals of a bit line that are read from the memory cell array.

For the fastest possible data access, it is important, then, that when a row of the memory cell array is activated, the temporal sequences can in each case be reproduced as exactly and identically as possible. In other words, irrespective of which row of the memory cell array is accessed, the temporal sequence should be able to be simulated as exactly as possible for every data access.

FIG. 5 shows the second current path for the timer start signal RAVLD that is supplied by the control circuit 6 in an existing DRAM, that is to say, in particular, the sense amplifier timer 7. This second current path 2 principally has inverters and thin oxide transistors which are operated by a standard supply voltage Vint. In this case, signals RPRE (Row Precharge), MUXBST (Multiplexer Boost), SAE (Sense Amplifier Enable) and bGWLOFF (Word Line Off) are generated from the start signal RVALD. FSWLE denotes a basic delay circuit.

SUMMARY OF THE INVENTION

It is accordingly an object of the invention to provide a circuit configuration for generating sense amplifier control signals for a memory which, upon activation, is adapted in its behavior to the greatest possible extent to the first current path, despite technologically dictated fluctuations and changes in the voltages, so that the two current paths are largely matched to one another. This also applies to technological fluctuations that occur during the fabrication of the memory.

With the foregoing and other objects in view there is provided, in accordance with the invention, a circuit configuration for generating sense amplifier control signals for a memory. The circuit configuration includes: a first current path for activating an addressed word line of the memory; a second current path including a control device for generating sense amplifier control signals from a signal obtained from the first current path; and a voltage supply device for supplying a first (normal) supply voltage and an increased supply voltage that is greater than the first supply voltage. The second current path includes thick oxide transistors and thin oxide transistors. The voltage supply device supplies the thin oxide transistors with the first supply voltage and supplies the thick oxide transistors with the increased supply voltage. The first current path includes components that are supplied with the first supply voltage.

In the case of a sense amplifier timer of the type mentioned in the introduction, the object of the invention is achieved by virtue of the fact that in the second current path, thick oxide transistors are also provided in addition to thin oxide transistors, and in that, from the voltage supply device the thin oxide transistors are operated with a normal supply voltage Vint and the thick oxide transistors are operated with an increased supply voltage VPP.

In the circuit configuration according to the invention, that is to say in the current path for the start signal RAVLD, use is therefore made—as in the first current path—both of thin oxide transistors, which are operated with the standard supply voltage Vint, and of thick oxide transistors, which are operated with the increased supply voltage VPP. In this case, the basic delay is still set by the thin oxide transistors, but in the current path these thin oxide transistors are followed by thick oxide transistors which are operated with the increased voltage VPP. This use of thin oxide transistors and thick oxide transistors and also the use of the standard supply voltage Vint and the increased supply voltage VPP better compensates for possible fluctuations in the supply voltages and also compensates for technological fluctuations—dictated by the fabrication process—in the thin oxide transistors and thick oxide transistors in both current paths, with the result that the effects of adjustments deviating from a standard value, for example, of the increased supply voltage VPP in both current paths are automatically matched to one another. Moreover, it is possible largely to preclude malfunctions and losses of yield because of fabrication-dictated process fluctuations.

As a result, a simulation of the row access in a memory, in particular a DRAM, becomes possible. The simulation is compensated with respect to technological fluctuations and fluctuations in the supply voltages, with the result that an optimized sense timing of the sense amplifiers is achieved. This essential advantage is based on the use for the first time of thick oxide transistors and also the use of the increased supply voltage VPP in the sense amplifier timer located in the (second) current path of the start signal RAVLD.

In accordance with a concomitant feature of the invention, the circuit configuration includes: a basic delay circuit constructed from thin oxide transistors, and a word line timer constructed from thick oxide transistors.

Other features which are considered as characteristic for the invention are set forth in the appended claims.

Although the invention is illustrated and described herein as embodied in a circuit configuration for generating sense amplifier control signals, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
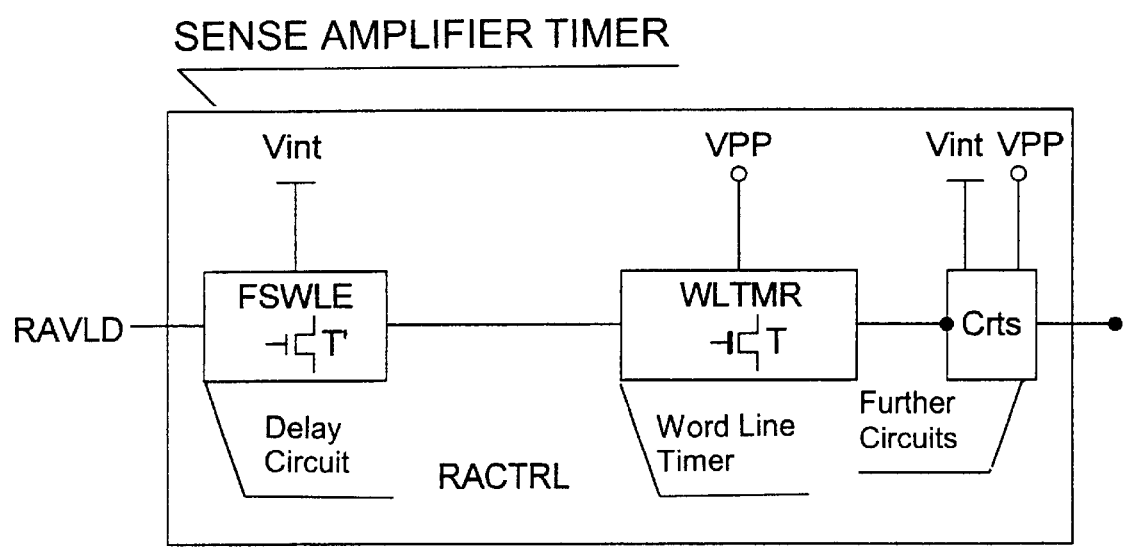
FIG. 1 shows a schematic block diagram of an exemplary embodiment of a sense amplifier timer or second current path.
Figure 5:
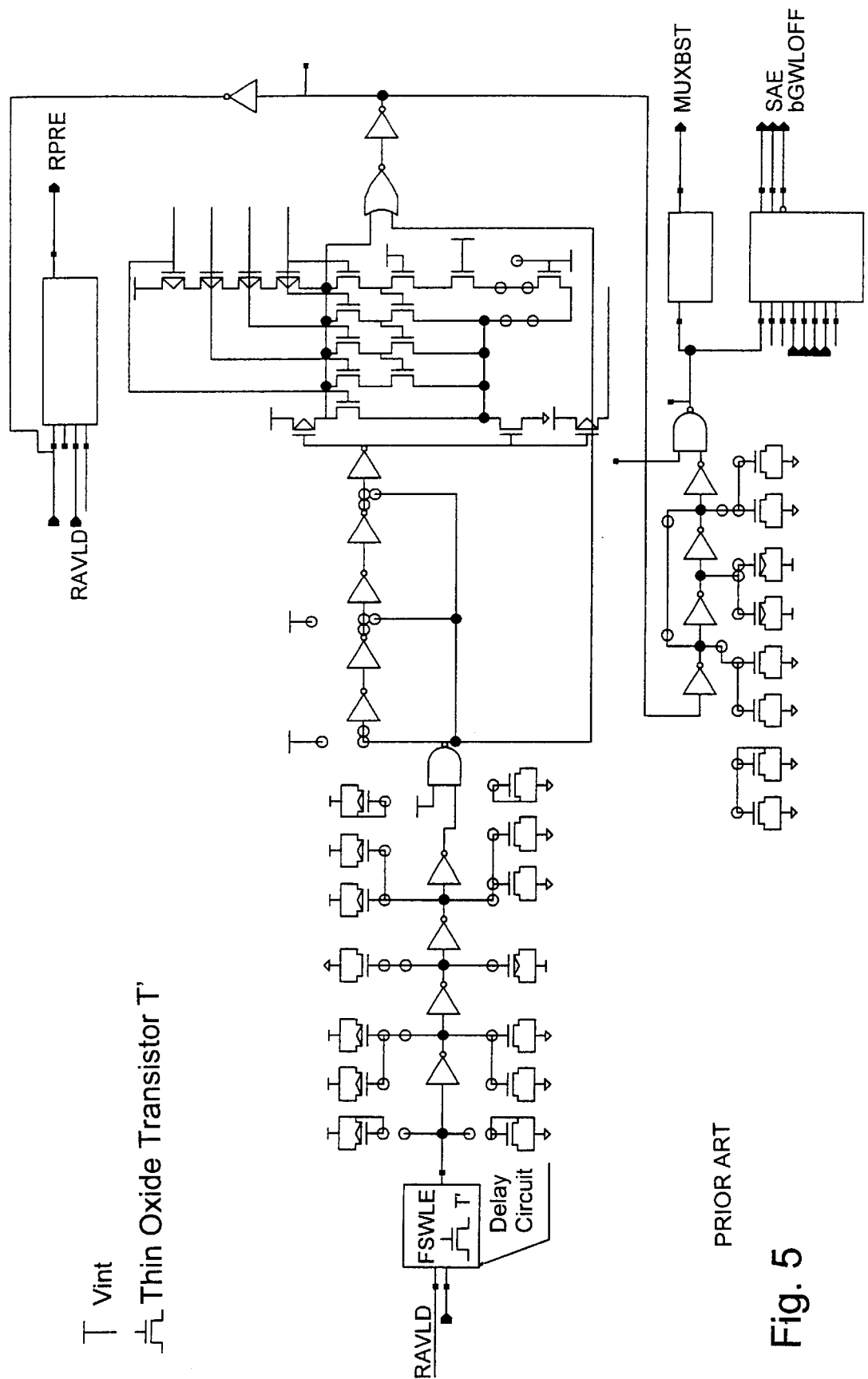
FIG. 5 shows a prior art sense amplifier timer for a DRAM.

Referring now to the figures of the drawing in detail and first, particularly, to FIG. 1 thereof, there is shown an exemplary embodiment of the sense amplifier timer RACTRL with a basic delay circuit FSWLE, which is essentially constructed as known in the prior art (cf. FIG. 5)—from thin oxide transistors T' and inverters including such transistors and is supplied with the standard supply voltage Vint. This basic delay circuit FSWLE is connected to a word line timer WLTMR, which—as can be seen from FIG. 3—is constructed from inverters including thick oxide transistors T, and further thick oxide transistors. These thick oxide transistors are operated with the increased supply voltage VPP. This word line timer WLTMR is followed by further circuits Crts with inverters, which include thick oxide transistors, and thick and also thin oxide transistors. The thick oxide transistors are each supplied with the increased supply voltage VPP and the thin oxide transistors are supplied with the standard supply voltage Vint.

Figure 2:
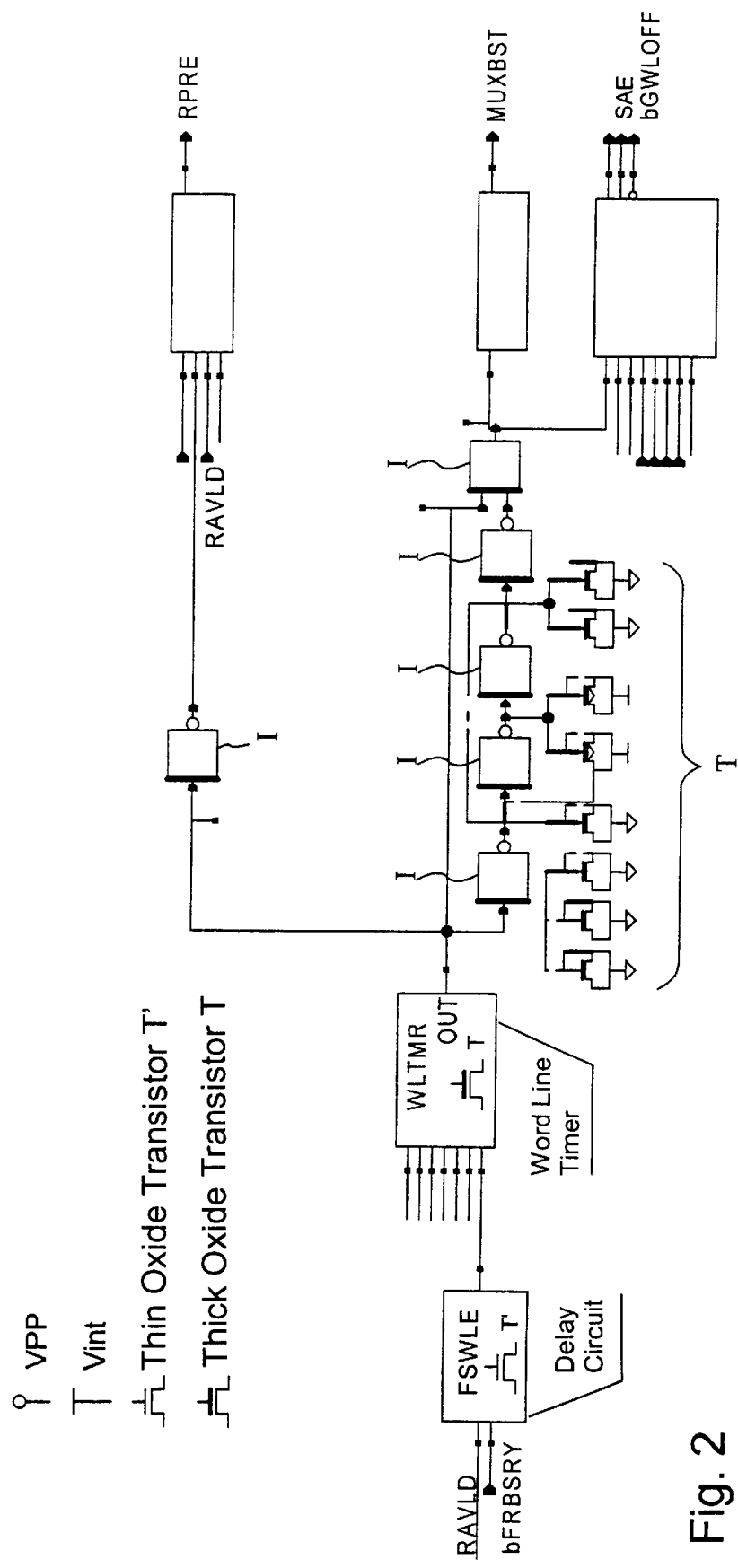
FIG. 2 shows a circuit diagram of a circuit configuration with the sense amplifier timer.

FIG. 2 shows an exemplary embodiment of the sense amplifier timer with a basic delay circuit FSWLE, to which the start signal RAVLD from the central control unit for a quadrant of the DRAM and the signal bFRBSRY are fed. The word line timer WLTMR and the further inverters I include thick oxide transistors T, to which the increased supply voltage VPP is connected, and thin oxide transistors T' (not separately illustrated) to some of which the supply voltage Vint is applied.

Figure 3:
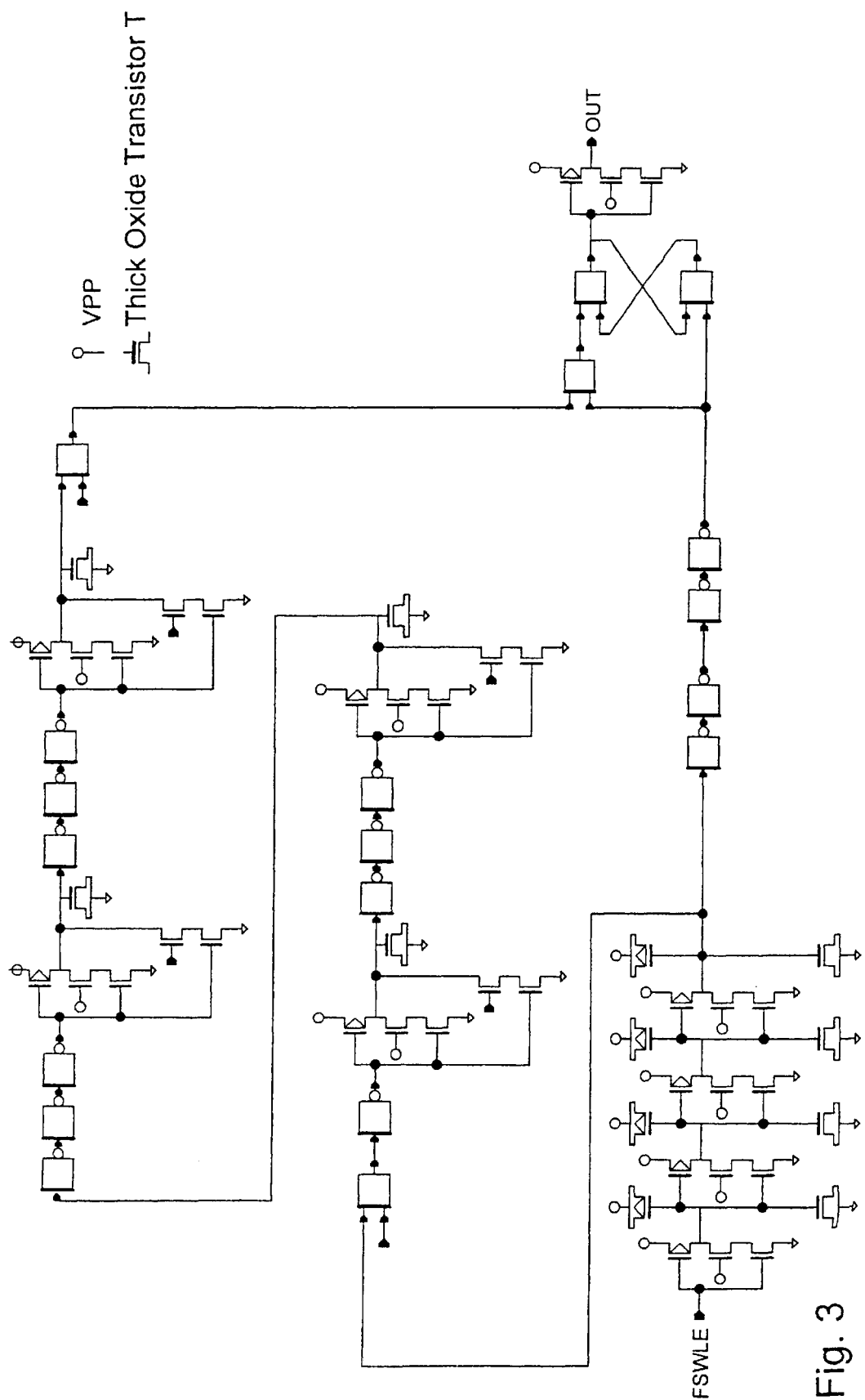
FIG. 3 shows a circuit diagram of a word line timer WLTMR in the sense amplifier timer.
Figure 4:
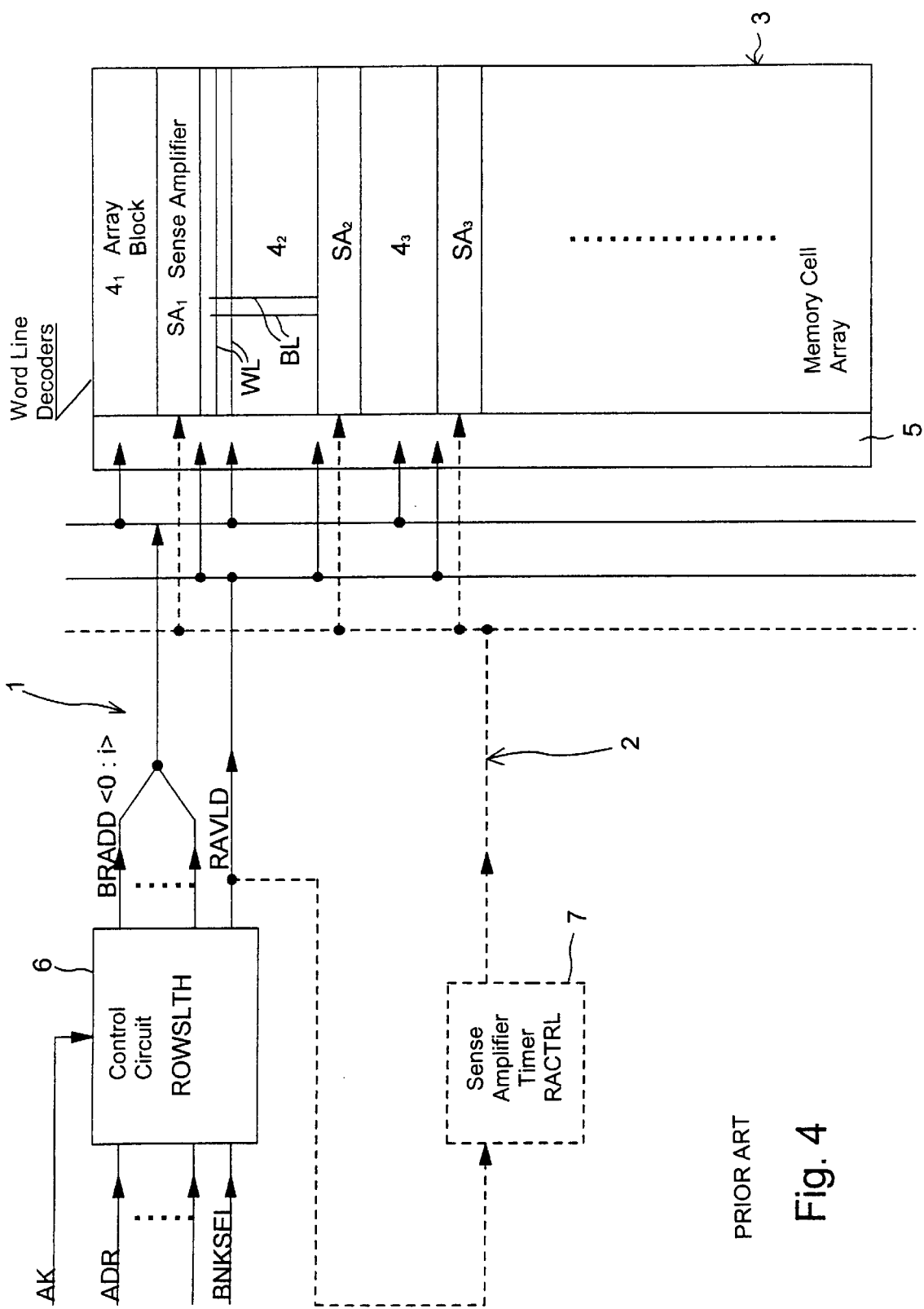
FIG. 4 shows a prior art configuration with two current paths.

The construction of the word line timer WLTMR can be seen from FIG. 3. This word line timer WLTMR essentially includes inverters, which are constructed from thick oxide transistors, and further thick oxide transistors. The increased supply voltage VPP is applied to all these thick oxide transistors.

In the circuit configuration according to the invention, then, the basic delay circuit FSWLE—as in the prior art (cf. FIG. 5)—is constructed from thin oxide transistors to which the standard supply voltage Vint is applied, while the word line timer WLTMR includes thick oxide transistors which are supplied with the increased supply voltage VPP. Moreover, additional inverters and thin and thick oxide transistors are present. The standard supply voltage Vint is applied to each of the thin oxide transistors and the increased supply voltage VPP is applied to the thick oxide transistors.

We claim:

1. A circuit configuration for generating sense amplifier control signals for a memory, which comprises:

a first current path for activating an addressed word line of the memory;

a second current path including a control device for generating sense amplifier control signals from a signal obtained from said first current path; and a voltage supply device for supplying a first supply voltage and an increased supply voltage that is greater than said first supply voltage;

said second current path including thick oxide transistors and thin oxide transistors;

said voltage supply device supplying said thin oxide transistors with the first supply voltage and supplying said thick oxide transistors with the increased supply voltage; and said first current path including components that are supplied with the first supply voltage.

2. The circuit configuration according to claim 1, comprising a basic delay circuit constructed from thin oxide transistors, and a word line timer constructed from thick oxide transistors.

* * * * *